United States Patent
Chou et al.

(10) Patent No.: US 11,742,210 B2
(45) Date of Patent: Aug. 29, 2023

(54) DEPOSITION WINDOW ENLARGEMENT

(71) Applicant: Taiwan Semiconductor Manufacturing Co., Ltd., Hsinchu (TW)

(72) Inventors: Meng-Han Chou, Hsinchu (TW); Kuan-Yu Yeh, Taoyuan (TW); Wei-Yip Loh, Hsinchu (TW); Hung-Hsu Chen, Tainan (TW); Su-Hao Liu, Chiayi County (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 17/231,670

(22) Filed: Apr. 15, 2021

(65) Prior Publication Data

US 2021/0407808 A1    Dec. 30, 2021

Related U.S. Application Data

(60) Provisional application No. 63/045,532, filed on Jun. 29, 2020.

(51) Int. Cl.
*H01L 21/285* (2006.01)
*H01L 21/02* (2006.01)
(Continued)

(52) U.S. Cl.
CPC .. *H01L 21/28518* (2013.01); *H01L 21/02063* (2013.01); *H01L 21/31111* (2013.01);
(Continued)

(58) Field of Classification Search
CPC ........ H01L 21/28518; H01L 21/02063; H01L 21/31111; H01L 21/31155;
(Continued)

(56) References Cited

U.S. PATENT DOCUMENTS

| 6,503,840 B2 * | 1/2003 | Catabay | ........... H01L 21/76843 |
| | | | 257/E21.252 |
| 7,238,578 B2 * | 7/2007 | Burbach | ............. H01L 29/7843 |
| | | | 257/E21.409 |

(Continued)

FOREIGN PATENT DOCUMENTS

| JP | H07130681 A | 5/1995 |
| JP | 2005086024 A | 3/2005 |

(Continued)

*Primary Examiner* — Dale E Page
*Assistant Examiner* — Quovaunda Jefferson
(74) *Attorney, Agent, or Firm* — HAYNES AND BOONE, LLP

(57) ABSTRACT

The present disclosure provides a method to enlarge the process window for forming a source/drain contact. The method may include receiving a workpiece that includes a source/drain feature exposed in a source/drain opening defined between two gate structures, conformally depositing a dielectric layer over sidewalls of the source/drain opening and a top surface of the source/drain feature, anisotropically etching the dielectric layer to expose the source/drain feature, performing an implantation process to the dielectric layer, and after the performing of the implantation process, performing a pre-clean process to the workpiece. The implantation process includes a non-zero tilt angle.

20 Claims, 10 Drawing Sheets

(51) Int. Cl.
*H01L 21/3115* (2006.01)
*H01L 29/45* (2006.01)
*H01L 21/768* (2006.01)
*H01L 21/311* (2006.01)

(52) U.S. Cl.
CPC .. *H01L 21/31155* (2013.01); *H01L 21/76805* (2013.01); *H01L 21/76814* (2013.01); *H01L 21/76895* (2013.01); *H01L 29/45* (2013.01)

(58) Field of Classification Search
CPC ......... H01L 21/76805; H01L 21/76814; H01L 21/76895; H01L 21/76897; H01L 21/32134; H01L 21/76825; H01L 21/76864; H01L 21/823871; H01L 21/823821; H01L 21/31116; H01L 21/76877; H01L 21/823468; H01L 21/823475; H01L 29/45; H01L 29/41791
See application file for complete search history.

(56) References Cited

U.S. PATENT DOCUMENTS

| | | | |
|---|---|---|---|
| 9,520,362 | B2 | 12/2016 | Lin |
| 9,613,856 | B1 | 4/2017 | Yang |
| 9,716,032 | B2 | 7/2017 | Tang |
| 9,972,529 | B2 | 5/2018 | Yang |
| 10,163,691 | B2 | 12/2018 | Shih |
| 10,170,322 | B1 | 1/2019 | Cheng |
| 2005/0087516 | A1* | 4/2005 | Duerksen .......... H01L 21/76832 257/E21.345 |
| 2011/0272765 | A1* | 11/2011 | Seo .................... H01L 29/7833 257/E21.409 |
| 2018/0166329 | A1* | 6/2018 | Huang ................ H01L 29/665 |

FOREIGN PATENT DOCUMENTS

| | | |
|---|---|---|
| JP | 2006203007 A | 8/2006 |
| KR | 20000012966 A | 3/2000 |
| KR | 20190063360 A | 6/2019 |

* cited by examiner

DEPOSITION WINDOW ENLARGEMENT

PRIORITY DATA

The present application claims the benefit of U.S. Provisional Application No. 63/045,532, entitled "Contact Deposition Window Enlargement," filed Jun. 29, 2020, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, a dielectric liner may be formed on sidewalls of a contact feature, such as a source/drain contact, to prevent leakage. To form a dielectric liner, a dielectric material is conformally deposited over a contact opening and an etch back process is performed to expose the top-facing surfaces. While the deposition of the dielectric material is intended to be conformal, accumulation may take place around edges of the opening, leading to a necking profile and reduction of the contact opening. When depositing a metal fill layer in the contact opening to form a metal plug, the accumulations around the edges may hinder the deposition of the metal fill layer, resulting in voids or other defects in the metal plug. Such voids or defects may lead to increased contact resistance or even failure of the contact. Therefore, while existing processes to form a contact feature are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this disclosure and are therefore not to be considered limiting in scope, for the disclosure may apply equally well to other embodiments.

DETAILED DESCRIPTION

Figure 1:
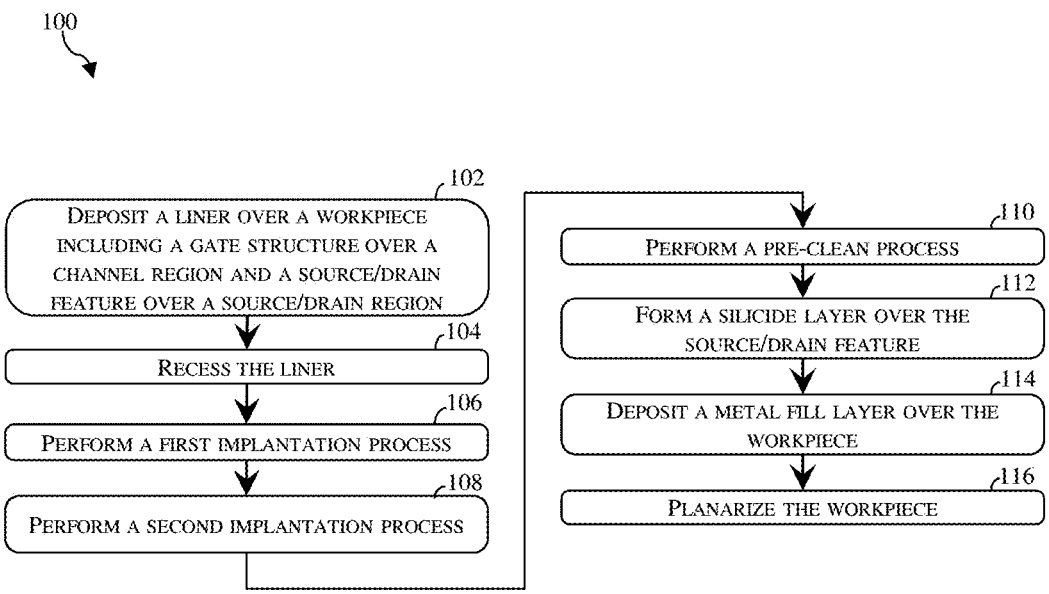
FIG. 1 is a flowchart illustrating a method of fabricating a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method to enlarge the process window for forming a contact feature.

In IC fabrication processes, efforts are being invested to reduce leakage of a contact feature without increasing contact resistance. Taking a source/drain contact for example, a dielectric liner may be deposited along sidewalls of a source/drain contact opening to improve isolation between the source/drain contact and an adjacent gate contact via to reduce leakage. In an example process, a dielectric material for the dielectric liner is conformally deposited over the source/drain contact opening and then an etch back process is performed to expose the source/drain feature. Even with the etch back process, the dielectric material may accumulate around edges of the source/drain contact opening to cause the source/drain contact opening to have a necking profile. That is, a top opening window of the source/drain contact opening may be smaller than the rest of the source/drain contact opening. The reduction of the top opening window may reduce the process window when depositing a metal fill layer in the source/drain contact opening to form a metal plug as the access to the source/drain contact opening is restricted. When the necking profile is present, the metal fill layer being deposited may prematurely merge and close off the top opening window before the source/drain contact opening is substantially filled with the metal fill layer. As a result, one or more voids may be formed in the metal plug. Voids in the metal plug displace the conductive metal fill layer and may increase resistance.

The present disclosure provides a method that reduces leakage of a contact feature without increasing the contact resistance. Taking formation of a source/drain contact as an example, methods of the present disclosure include an implantation process at a tilt angle to treat the accumulation of the dielectric liner around the edge of the source/drain contact opening. The implantation process may include use of germanium, xenon, argon, or silicon and the tilt angle may be between about 10° and about 85°. Due to such a treatment, the accumulation around the edge may be damaged or oxidized such that it becomes more susceptible to a subsequent pre-clean process. The pre-clean process etches the treated portion faster than it does the other portion of the dielectric liner, eliminating or reducing the accumulation around the edge. Using the implantation process in conjunction with the pre-clean process, methods of the present disclosure deposit a dielectric liner for leakage reduction without introducing defects to the source/drain contact.

The various aspects of the present disclosure will now be described in more detail with reference to the figures. In that regard, FIG. 1 is a flowchart illustrating method 100 of forming a semiconductor device according to one or more aspects of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-10, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires.

As illustrated in FIGS. 2-10, operations and advantages of method 100 will be described in detail using fin-type field effect transistors (FinFETs) as an example. However, embodiments of the present disclosure are not so limited and may be applied to multi-bridge-channel (MBC) transistors. FinFETs and MBC transistors are examples of multi-gate devices, which have been introduced to improve gate control by increasing gate-channel coupling, reducing off-state current, and reducing short-channel effects (SCEs). A FinFET has an elevated channel wrapped by a gate structure on more than one side (for example, the gate structure wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may include nanowires, nanosheets, other nanostructures, and/or other suitable structures. The shapes of the channel region have also given an MBC transistor alternative names such as a nanosheet transistor or a nanowire transistor. Additionally, process embodiments of the present disclosure may be applied to formation of a semiconductor device features where a fill material is to be deposited into an opening lined by a liner and voids in the semiconductor device feature are not desirable.

Figure 2:
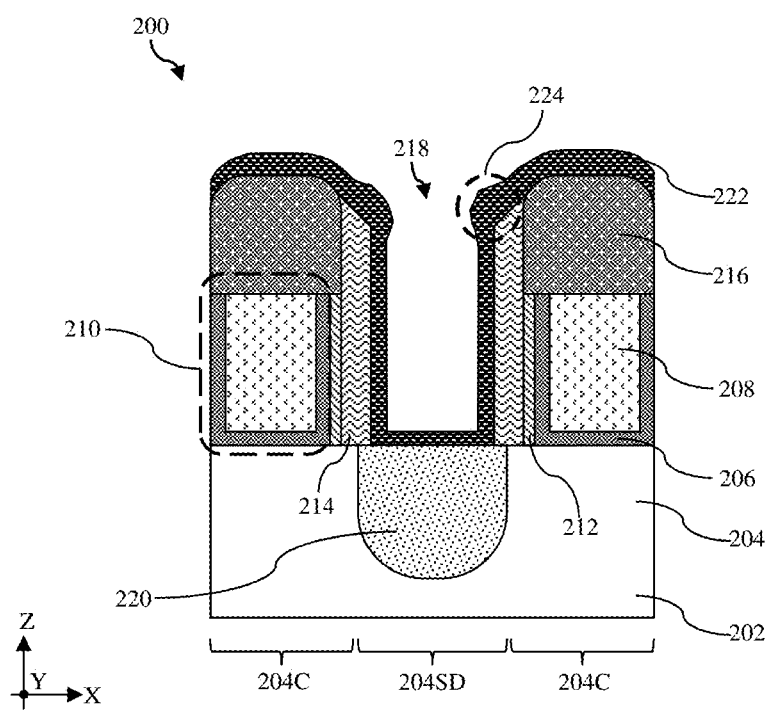
FIGS. 2-10 illustrate fragmentary cross-sectional views of a workpiece at various stages of fabrication in the method of FIG. 1, according to one or more aspects of the present disclosure.

Reference is first made to FIGS. 1 and 2. Method 100 includes a block 102 where a liner 222 is deposited over a workpiece 200. As shown in FIG. 2, the workpiece 200 includes a substrate 202 and a fin structure 204 rising from the substrate 202. The fin structure 204 extends lengthwise along the X direction and is divided into source/drain regions 204SD and channel regions 204C. One source/drain region 204SD and two channel regions 204C are shown in FIG. 2. A gate structure 210 is disposed over each of the channel regions 204C. A source/drain feature 220 is disposed over each of the source/drain regions 204SD. Each of the gate structure 210 includes a gate dielectric layer 206 and a gate electrode layer 208. Sidewalls of each of the gate structures 210 is lined by a first gate spacer layer 212 and a second gate spacer layer 214. A gate self-aligned contact (SAC) dielectric layer 216 is disposed over each of the gate structures 210.

The substrate 202 may be a silicon substrate. Alternatively or additionally, the substrate 202 may include other elementary semiconductor materials such as germanium. In some embodiments, the substrate 202 is made of a compound semiconductor such as silicon carbide, gallium arsenic, indium arsenide, or indium phosphide. In some embodiments, the substrate 202 is made of an alloy semiconductor such as silicon germanium, silicon germanium carbide, gallium arsenic phosphide, or gallium indium phosphide. In some embodiments, the substrate 202 includes one or more epitaxial layers. For example, the substrate 202 may include an epitaxial layer overlying a bulk semiconductor. In some embodiments, the substrate 202 may include a buried insulator layer, such as a buried silicon oxide layer, and may be a silicon-on-insulator (SOI) substrate.

The fin structure 204 extends vertically from the substrate 202 along the Z-direction. The fin structures 204 are elongated in the X-direction. The fin structures 204 may be formed from the substrate 202 and may share the same materials with the substrate 202. Alternatively, the fin structures 204 may be formed from not only the substrate 202 but also epitaxial layers formed on the substrate 202. In these alternative embodiments, the fin structures 204 may include germanium (Ge) or other semiconductor materials. The fin structure 204 may be formed by using suitable processes such as photolithography and etching processes. In some embodiments, the fin structure 204 is etched from the substrate 202 using dry etch or plasma processes. In some other embodiments, the fin structure 204 can be formed by a double-patterning lithography (DPL) process or a multiple-patterning lithography (MPL) process. DPL is a method of constructing a pattern on a substrate by dividing the pattern into two interleaved patterns. DPL allows enhanced feature (e.g., fin) density. An isolation structure (not shown), such as a shallow trench isolation (STI) structure, is formed to surround the fin structure 204. In some embodiments, a lower portion of the fin structure 204 is surrounded by the isolation structure, and an upper portion of the fin structure 204 protrudes from the isolation structure. In other words, a portion of the fin structure 204 is embedded in the isolation structure. The isolation structure prevents electrical interference or crosstalk.

Although not explicitly shown, the gate dielectric layer 206 includes an interfacial layer disposed on the channel region 204C of the fin structure 204 and a high-k dielectric layer disposed over the interfacial layer. Here, a high-k dielectric layer refers to a dielectric material having a dielectric constant greater than that of silicon dioxide, which is about 3.9. In some embodiments, the interfacial layer includes silicon oxide and silicon hafnate and may be formed in a cleaning process. An example cleaning process here may include use of RCA SC-1 (a mixture of ammonium hydroxide, hydrogen peroxide and water) and/or RCA SC-2 (a mixture of hydrochloric acid, hydrogen peroxide and water). The high-K dielectric layer is then deposited over the interfacial layer using atomic layer deposition (ALD), chemical vapor deposition (CVD), and/or other suitable methods. The high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material.

The gate electrode layer 208 is then deposited over the gate dielectric layer 206 using ALD, physical vapor deposition (PVD), CVD, e-beam evaporation, or other suitable methods. The gate electrode layer 208 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 208 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers).

The workpiece 200 may include one or more gate spacer layers disposed along sidewalls of the gate structure 210. In the embodiments represented in FIG. 2, the workpiece 200 includes two gate spacers—the first gate spacer layer 212 and the second gate spacer layer 214 over the first gate spacer layer 212. When a gate-last process (or a gate replacement process) is adopted, polysilicon dummy gate stacks are first formed over the channel regions 204C and the gate spacer layers are deposited over the sidewalls of the dummy gate stacks. In subsequent processes, the dummy gate stacks are removed and replaced by the gate structures 210 while at least a portion of the gate spacer layers remain disposed along sidewalls of the gate structures 210. In some embodiments, the first gate spacer layer 212 and the second gate spacer layer 214 are conformally deposited using CVD, subatmospheric CVD (SACVD), or ALD. The first gate spacer layer 212 and the second gate spacer layer 214 may be formed of different dielectric materials selected from silicon oxide, silicon nitride, silicon carbide, silicon oxynitride, silicon carbonitride, silicon oxycarbide, silicon oxycarbonitride, and/or combinations thereof. In one embodiment, the first gate spacer layer 212 includes silicon carbonitride and the second gate spacer layer 214 includes silicon nitride.

The gate SAC dielectric layer 216 may include silicon nitride, silicon oxynitride, silicon oxycarbonitride, or silicon carbonitride. A composition of the gate SAC dielectric layer 216 may be the same as a composition of the second gate spacer layer 214. In some embodiments represented in FIG. 2, the second gate spacer layer 214 is deposited after the formation of the gate SAC dielectric layer 216. In these embodiments, the gate SAC dielectric layer 216 is disposed over top surfaces of the gate structure 210 and the first gate spacer layer 212. The second gate spacer layer 214 extends continuously along a sidewall of the first gate spacer layer 212 and a sidewall of the gate SAC dielectric layer 216.

Depending on the conductivity type of the semiconductor device 200, the source/drain feature 220 may be either n-type or p-type. When the source/drain feature 220 is n-type, it may include phosphorus-doped silicon (Si:P), arsenic-doped silicon (Si:As), or antimony-doped silicon (Si:Sb). When the source/drain feature 220 is p-type, it may include boron-doped silicon germanium (SiGe:B) or gallium-doped silicon germanium (SiGe:Ga). The source/drain feature 220 may be formed using vapor phase epitaxy (VPE), molecular beam epitaxy (MBE), or a suitable epitaxial deposition process. The source/drain feature 220 may be doped in-situ during the deposition process or ex-situ using an implantation process.

At block 102, the liner 222 is conformally deposited over the workpiece 200. In some embodiments, the liner 222 may include a dielectric material. Example dielectric materials for the liner 222 include silicon nitride, silicon carbonitride, or silicon. These example dielectric materials are dense and provide satisfactory leakage prevention. In some implementations, the liner 222 may be deposited using CVD, plasma-enhanced CVD (PECVD), low-pressure CVD (LPCVD), or subatmospheric CVD (SACVD). Because the liner 222 is formed of dielectric materials, it may also be referred to as a dielectric liner 222. As shown in FIG. 2, the liner 222 is disposed over the gate SAC dielectric layer 216, top surfaces of the second gate spacer layer 214, sidewalls of the second gate spacer layer 214, and a top surface of the source/drain feature 220. The sidewalls of the second gate spacer layer 214 and a top surface of the source/drain feature 220 collectively define a source/drain contact opening 218 over the source/drain feature 220. Put differently, the liner 222 is deposited conformally over surfaces of the source/drain contact opening 218. In some embodiments illustrated in FIG. 2, the dielectric material for the liner 222 may accumulate around edges of the top opening window of the source/drain contact opening 218 to form edge accumulation 224. The edge accumulation 224 may result in a necking profile shown in FIG. 2. With respect to materials to be deposited into the source/drain contact opening, such necking profile may restrict access to or entry into the source/drain contact opening 218. As described above, the edge accumulation 224 representatively shown in FIG. 2 may lead to voids when a metal fill layer is subsequently deposited in the source/drain contact opening 218.

Figure 3:
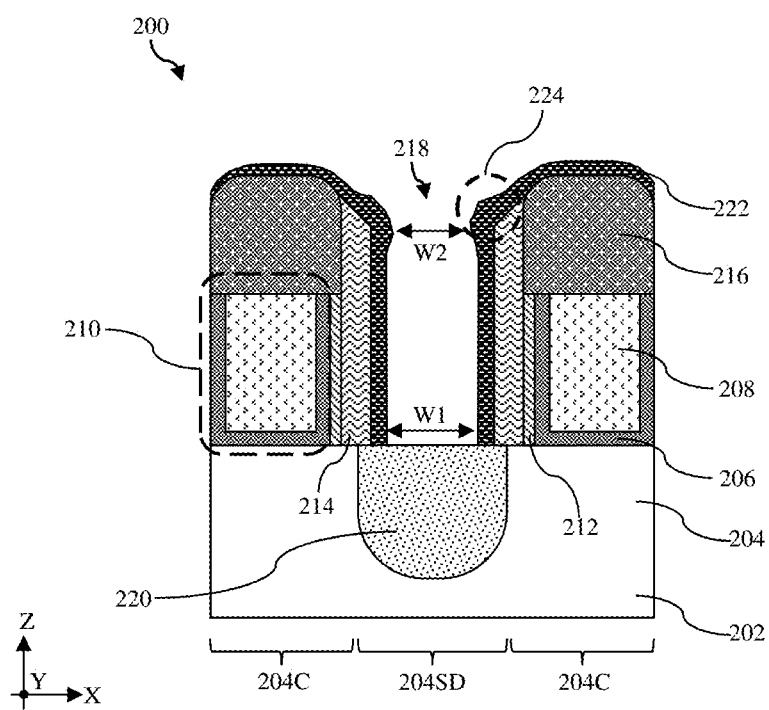

Referring to FIGS. 1 and 3, method 100 includes a block 104 where the liner 222 is recessed. In some embodiments, the workpiece 200 is subject to an anisotropic etch process at block 104 to remove the liner 222 disposed on the source/drain feature 220. As shown in FIG. 3, upon conclusion of the operations at block 104, at least a portion of the source/drain feature 220 is exposed in the source/drain contact opening 218 and a thickness of the portion of the liner 222 on the gate SAC dielectric layer 216 is reduced. In some implementations, the anisotropic etch process may include a reactive ion etching (RIE) process that uses hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. After the recessing at block 104, the liner 222 may have a thickness between about 0.5 nm and about 5 nm. In some embodiments, the anisotropic etch process at block 104 does not completely remove the edge accumulation 224 and does not substantially reduce the thickness of the liner 222 along sidewall of the source/drain contact opening 218. Referring to FIG. 3, the source/drain contact opening 218 includes a bottom opening width (W1) and a top opening width (W2) along the X direction. In some embodiments, when the top opening width W2 is between about 10 nm and about 15 nm, the top opening width W2 is smaller than the bottom opening width W1 by a necking bias between about 1 nm and about 5 nm.

Figure 4:
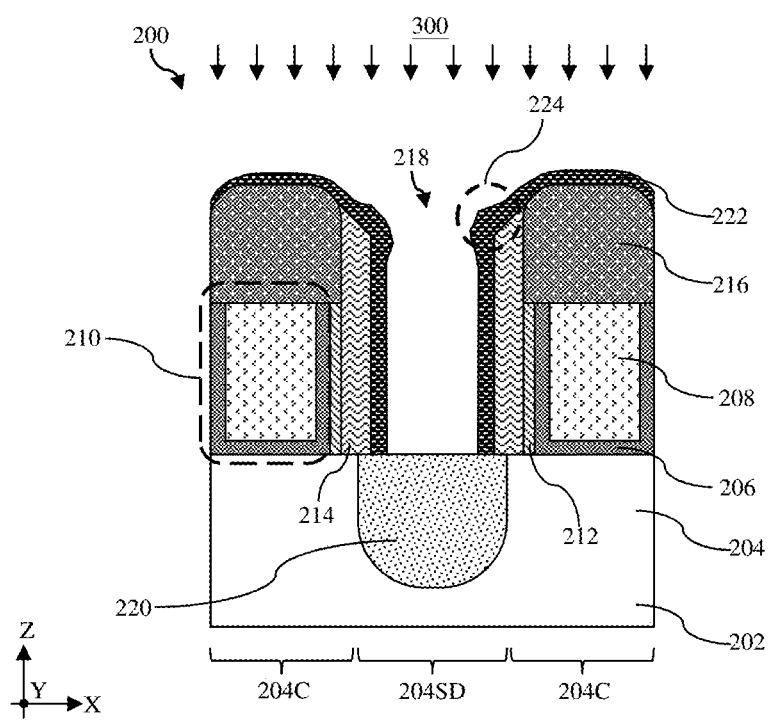

Referring to FIGS. 1 and 4, method 100 includes a block 106 where a first implantation process 300 is performed. The first implantation process 300 is performed more for the benefit of the p-type device than for the benefit of the n-type device. In some instances, p-type source/drain feature 220 may have uneven germanium distribution due to germanium aggregation, which may result in unsatisfactory silicide formation thereon. In some embodiments, the first implantation process 300 implants germanium (Ge) to provide a uniform germanium distribution on the exposed surface of the p-type source/drain features 220. Because the first implantation process 300 is directed to the source/drain feature 220 down the source/drain contact opening 218, the first implantation process 300 includes a zero-degree (0°) tilt angle relative to the Z direction, which is the direction perpendicular to a top surface of the substrate 202. To prevent damages to the source/drain feature 220, the first implantation process 300 includes a moderate ion beam energy between about 1 keV and about 10 keV and an implantation dosage between about $5 \times 10^{13}$ ions/cm$^2$ and about $2 \times 10^{14}$ ions/cm$^2$. In some embodiments, the first implantation process 300 is performed at a temperature between about −100° C. and about 300° C. The first implantation process 300 may be referred to as a pre-silicide implantation process.

Figure 5:
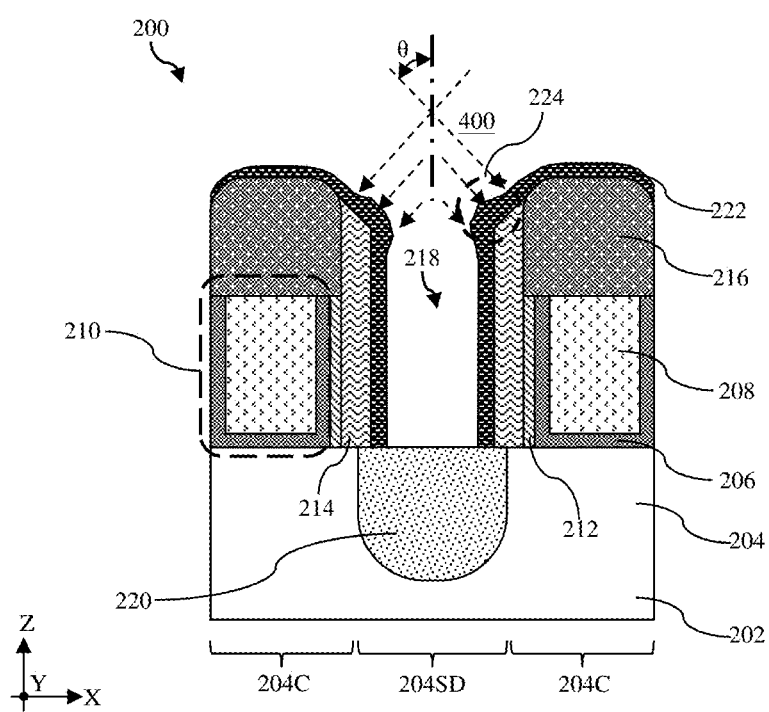
Figure 6:
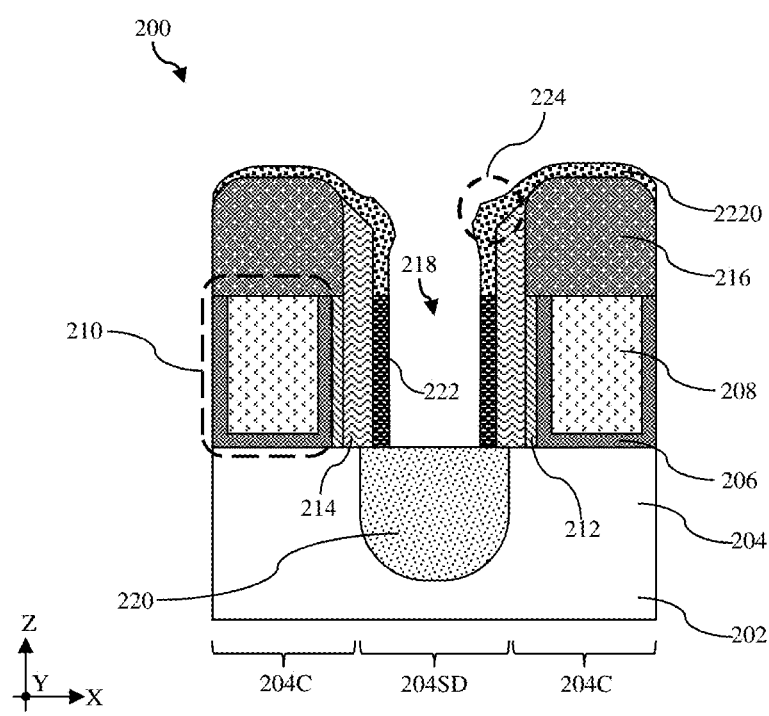

Referring to FIGS. 1, 5 and 6, method 100 includes a block 108 where a second implantation process 400 is performed. Different from the first implantation process 300 that is directed to the source/drain feature 220, the second implantation process 400 aims away from the source/drain feature 220 and is directed to the edge accumulation 224. According to the present disclosure, the second implantation process 400 is configured to inflict damages to the edge accumulation, in order to make it more vulnerable to a subsequent pre-clean process 500 (to be described below). As a result, the second implantation process 400 includes a tilt angle θ that is a non-zero angle. In some embodiments, the tilt angle θ of the second implantation process 400 may be between about 10° and about 85°, relative to the Z direction. Because the second implantation process 400 is not intended to even out the germanium distribution in the source/drain feature 220, the second implantation process 400 may include ion species other than germanium (Ge). In some embodiments, the second implantation process 400 includes ion species such as germanium (Ge), silicon (Si), xenon (Xe), or argon (Ar). In one embodiment, the second implantation process 400 includes use of xenon (Xe) or argon (Ar). Because the second implantation process 400 functions to inflict damages to the edge accumulation 224, the ion beam energy and the dose of the second implantation process 400 may be greater than those of the first implantation process 300. In some embodiments, the second implantation process 400 may include an ion beam energy between about 1 keV and about 50 keV and a dose between about $5 \times 10^{13}$ ions/cm$^2$ and about $1 \times 10^{16}$ ions/cm$^2$. The second implantation process 400 may be performed at a temperature between about −100° C. and about 500° C. With the aforementioned implantation conditions, the second implantation process 400 may cause localized damages to the liner 222 and convert a portion of the liner 222 in the line of sight of the ion beams into a treated portion 2220. The liner 222 outside the line of sight of the ion beams may not be substantially damaged or oxidized. In some embodiments represented in FIG. 6, the treated portion 2220 may include the portions of the liner 222 over the gate SAC dielectric layer 216 and near the accumulation around the edges 224 (or edge accumulation 224). When the vacuum of the second implantation process 400 is broken and the workpiece 200 is exposed to an oxygen-containing ambient, the treated portion 2220 may be oxidized due to the damages inflicted by the second implantation process 400. The treated portion 2220 may include silicon oxynitride, silicon oxycarbonitride, or silicon oxide. Therefore, the treated portion 2220 may be regarded as a damaged portion or an oxidized portion (if oxidized) of the liner 222. It is observed that, when xenon (Xe) or argon (Ar) is used in the second implantation process 400, traces of xenon (Xe) or argon (Ar) may be detected in the treated portion 2220.

The tilt angle θ and ion beam energy of the second implantation process 400 may be adjusted to achieve different shapes or depth of the treated portion 2220. For example, when the tilt angle θ is between about 10 degrees and about 30 degrees, the line of sight of the second implantation process 400 may reach further down the source/drain contact opening 218. As a result, the treated portion 2220 may extend further down the source/drain contact opening 218. When the tilt angle θ is between about 30 degrees and about 60 degrees, the line of sight of the second implantation process 400 may impact the edge portion 224 head-on and reach moderately down the source/drain contact opening 218. When the tilt angle θ is between about 60 degrees and about 85 degrees, the line of sight of the second implantation process 400 is less likely to reach down the source/drain contact opening 218 and the treated portion 2220 extends little down the source/drain contact opening 218. Determination of the tilt angle θ may be a result of balancing factors such as contact opening sizes, parasitic capacitance, and damages to the source/drain feature 220. As a general matter, a smaller tilt angle θ may lead to enlargement of the source/drain contact opening 218, increase of parasitic capacitance (between the gate structure 210 and the to-be-formed source/drain contact), and damages to the source/drain feature 220). A greater tilt angle θ may not enlarge the source/drain contact opening as much but it is less likely to increase parasitic capacitance or cause damages to the source/drain feature 220. In some embodiments, when the second implantation process 400 includes sufficient ion beam energy, the ion species may penetrate into the second gate spacer layer 214 and cause localized damages in a portion of the second gate spacer layer 214 near the edge accumulation 224. In those embodiments, the second implantation process 400 may also make a portion of the second gate spacer layer 214 vulnerable to the pre-clean process 500 (to be described below).

Figure 7:
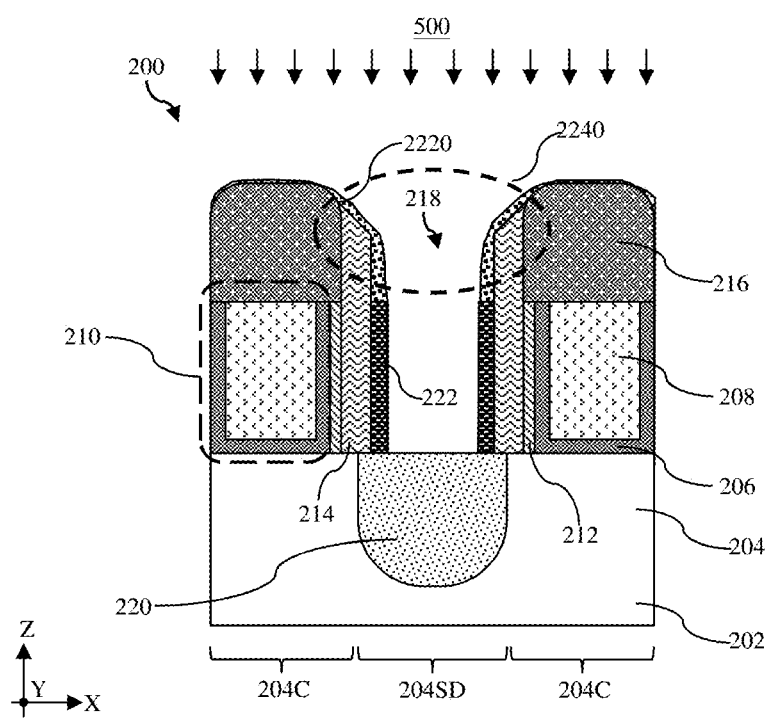

Referring to FIGS. 1 and 7, method 100 includes a block 110 where a pre-clean process 500 is performed. In some embodiments, the pre-clean process 500 may include use of hydrofluoric acid, ammonia, and water. It is observed that the pre-clean process 500 at block 110 removes the treated portion 2220 faster than it removes the liner 222. As a result, as shown in FIG. 7, the pre-clean process 500 at block 110 may reduce the thickness or bulging of the edge accumulation 224 to form a funnel profile 2240 at the top opening window of the source/drain contact opening 218. The funnel profile 2240 provides unhindered access to the source/drain contact opening 218. As is also shown in FIG. 7, the pre-clean process 500 reduces the thickness of the treated portion 2220 while the thickness of the liner 222 along the sidewalls of the source/drain contact opening 218 remains substantially unchanged. While not explicitly shown, in embodiments where a portion of the second gate spacer layer 214 near the edge accumulation 224 is also treated and damaged by the second implantation process 400, the pre-clean process 500 may also remove the treated portion of the second gate spacer layer 214. In those embodiments, the exposed second gate spacer layer 214 may define a portion of the sidewalls of the funnel profile 2240.

Figure 8:
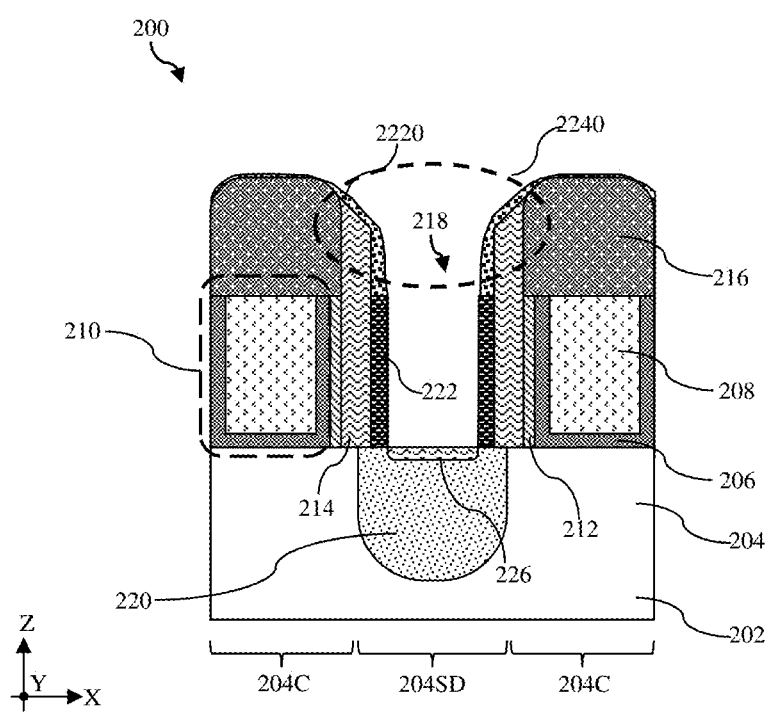

Referring to FIGS. 1 and 8, method 100 includes a block 112 where a silicide layer 226 is formed over the source/drain feature 220. In some embodiments, to reduce contact resistance, a silicide layer 226 may be formed on the exposed source/drain feature 220 by depositing a metal layer (or a metal precursor layer) over the source/drain contact opening 218 and performing an anneal process to bring about silicidation between the metal layer and the source/drain feature 220. Suitable metal layer for forming the silicide layer 226 may include titanium (Ti), tantalum (Ta), nickel (Ni), cobalt (Co), or tungsten (W). The silicide layer 226 may include titanium silicide (TiSi), titanium silicon nitride (TiSiN), tantalum silicide (TaSi), tungsten silicide (WSi), cobalt silicide (CoSi), or nickel silicide (NiSi). In some embodiments, the metal layer that is not converted into the silicide layer 226 is removed after the anneal process. In some alternative embodiments, the unreacted metal layer remains in place to serve as a conductive liner.

Figure 9:
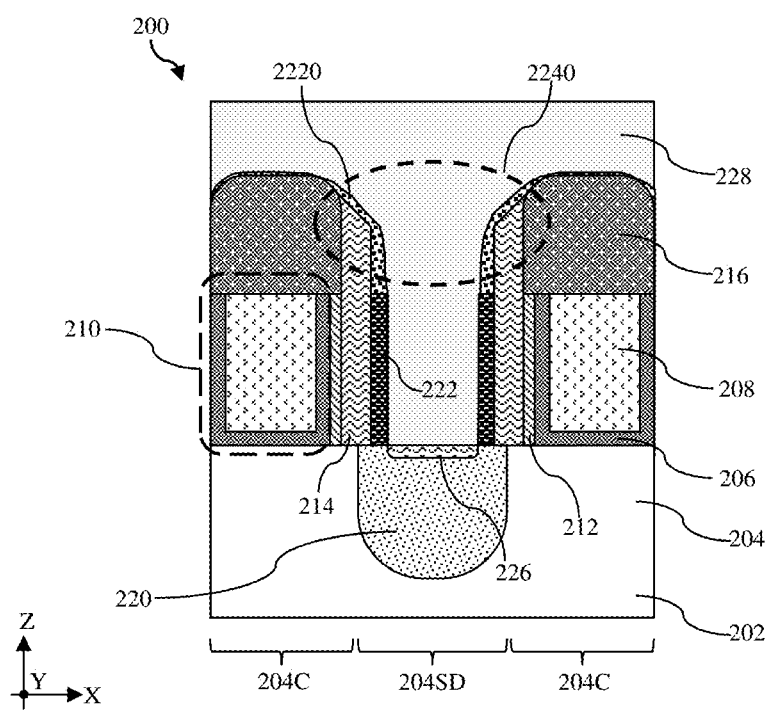

Referring to FIGS. 1 and 9, method 100 includes a block 114 where a metal fill layer 228 is deposited over the workpiece 200. After the formation of the silicide layer 226, a metal fill layer 228 may be deposited into the source/drain contact opening 218. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). As shown in FIG. 9, due to the funnel profile 2240 created by the combination of the second implantation process 400 and the pre-clean process 500, the process window for depositing the metal fill layer 228 into the source/drain contact opening 218 is substantially enlarged and the possibility of void formation is substantially reduced.

Figure 10:
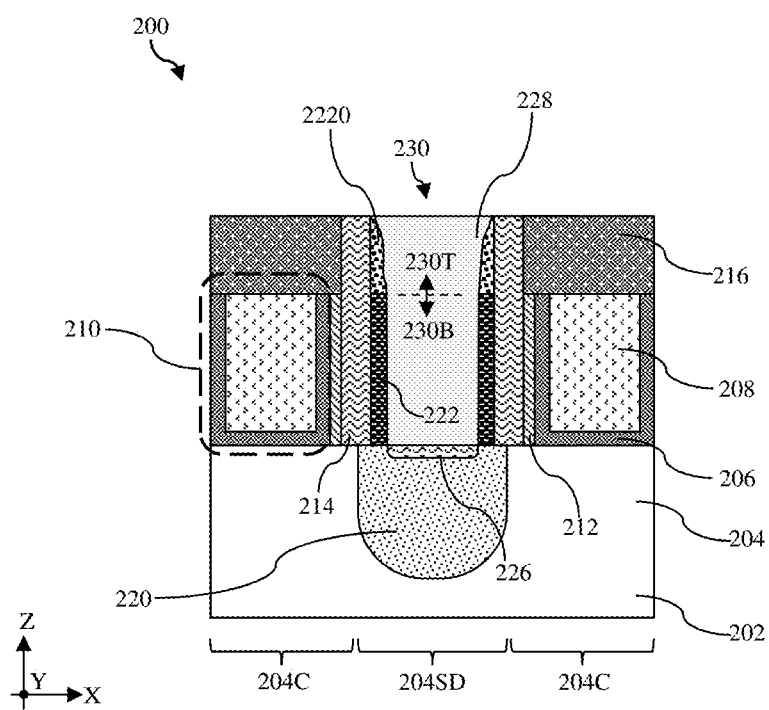

Referring to FIGS. 1 and 10, method 100 includes a block 116 where the workpiece 200 is planarized. As shown in FIG. 10, after the deposition of the metal fill layer 228, the workpiece 200 may be subject to a planarization process, such as a CMP process, to remove excess materials and provide a planar top surface. Upon the conclusion of the operations at block 116, a source/drain contact 230 is formed. When viewed along the Y direction, the source/drain contact 230 includes a bottom portion 230B disposed between two sidewall portions of the liner 222 and a top portion 230T disposed between two sidewall portions of the treated portion 2220. The top portion 230T is disposed over the bottom portion 230B. Compared to the liner 222, the treated portion 2220 further includes oxygen, trace of xenon (Xe) or trace of argon (Ar). Additionally, the treated portion 2220 may contain more defects than the liner 222 due to the second implantation process 400. As shown in FIG. 10, because the source/drain contact 230 is formed in the source/drain contact opening 218 that has the funnel profile 2240, the source/drain contact 230 also shares the funnel profile 2240. The source/drain contact 230 may be referred to as a metal plug.

Based on the above discussions, it can be seen that the present disclosure offers advantages over related processes. It is understood, however, that other embodiments may offer additional advantages, and not all advantages are necessarily disclosed herein, and that no particular advantage is required for all embodiments. For example, one advantage is that the processes disclosed in the present disclosure utilizes a tilt implantation process to treat accumulation of a dielectric material around edges of a contact opening when the dielectric material is conformally deposited to form a liner. The tilt implantation process may convert a portion of the liner into a treated portion that is damaged by the tilt implantation process. The treated portion is especially susceptible to a pre-clean process performed ahead of formation of a silicide layer. The pre-clean process may remove or reduce the accumulation of the dielectric material around the edge, thereby enlarging the top opening of the contact opening. The top opening may have a funnel shape. The enlarged top opening allows a larger process window when depositing a metal fill layer into the contact opening to form a contact feature.

One aspect of the present disclosure pertains to a method. The method includes conformally depositing a dielectric layer over a top surface of a source/drain feature exposed in a source/drain opening on a workpiece as well as sidewalls of the source/drain opening, anisotropically etching the dielectric layer to expose the source/drain feature, performing an implantation process to the dielectric layer, and after the performing of the implantation process, performing a pre-clean process to the workpiece. The implantation process includes a non-zero tilt angle.

In some embodiments, the dielectric layer includes silicon nitride, silicon carbonitride, or silicon. In some implementations, the implantation process includes use of xenon, or argon. In some instances, the non-zero tilt angle is between about 10° and about 85°. In some embodiments, the implantation process causes oxidation of the dielectric layer to form an oxidized portion of the dielectric layer and the pre-clean process removes the oxidized portion of the dielectric layer. In some instances, the implantation process causes damages to the dielectric layer to form a damaged portion of the dielectric layer and the pre-clean process removes the damaged portion of the dielectric layer. In some instances, the method may further include before the implantation process, performing a pre-silicide implantation process to the workpiece. The pre-silicide implantation process implants the exposed source/drain feature with germanium. In some embodiments, the pre-silicide implantation process includes a zero-degree tilt angle.

Another one aspect of the present disclosure pertains to a method. The method includes receiving a workpiece that includes a first gate structure, a second gate structure, a source/drain opening between the first gate structure and the second gate structure, and a source/drain feature exposed in the source/drain opening, conformally depositing a dielectric layer over sidewalls of the source/drain opening and a top surface of the source/drain feature, anisotropically etching the dielectric layer to expose the source/drain feature, performing a first implantation process to the exposed source/drain feature, after the performing of the first implantation process, performing a second implantation process to the dielectric layer to form a treated portion, and after the performing of the second implantation process, performing a pre-clean process to the workpiece. The pre-clean process etches the treated portion faster than it does the dielectric layer.

In some embodiments, the workpiece further includes a gate spacer disposed along sidewalls of the source/drain opening and the conformally depositing of the dielectric layer deposits the dielectric layer on the gate spacer. In some implementations, the pre-clean process includes use of hydrofluoric acid, ammonia, or water. In some implementations, the dielectric layer includes silicon nitride, silicon carbonitride, or silicon. In some instances, the first implantation process includes use of germanium and the second implantation process includes use of xenon, or argon. in some embodiments, the first implantation process includes a zero-degree tilt angle and the second implantation process includes a non-zero tilt angle. In some embodiments, an ion beam energy of the second implantation process is greater than an ion beam energy of the first implantation process. In some embodiments, an implantation dosage the second implantation process is greater than an implantation dosage of the first implantation process. In some implementations, the second implantation process includes a process temperature between about −100° C. and about 500° C.

Yet another aspect of the present disclosure pertains to a method. The method includes receiving a workpiece that includes a source/drain feature exposed in a source/drain opening defined between two gate structures, conformally depositing a dielectric layer over sidewalls of the source/drain opening and a top surface of the source/drain feature, anisotropically etching the dielectric layer to expose the source/drain feature, performing an implantation process to the dielectric layer to form a treated portion of the dielectric layer; after the performing of the implantation process, performing a pre-clean process to the workpiece, forming a silicide layer over the source/drain feature, and forming a metal plug over the silicide layer. The implantation process implants xenon or argon.

In some embodiments, after the anisotropically etching of the dielectric layer, the source/drain opening includes a necking profile and the pre-clean process reduces the necking profile by removing the treated portion. In some implementations, the forming of the silicide layer includes depositing a metal precursor over the workpiece, annealing the workpiece to bring about silicidation between the metal precursor and the source/drain feature to form the silicide layer, and removing the metal precursor along sidewalls of the source/drain opening.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
   receiving a workpiece comprising a semiconductor structure, a first gate structure over a first channel region of the semiconductor structure, a second gate structure over a second channel region of the semiconductor structure, and a source/drain feature over a source/drain region between the first channel region and the second channel region;
   conformally depositing a dielectric layer over a top surface of the source/drain feature and along sidewalls of the first gate structure and the second gate structure to define a source/drain opening between the first gate structure and the second gate structure;
   after the conformally depositing, anisotropically etching the dielectric layer to expose the source/drain feature;
   performing an implantation process to the dielectric layer; and
   after the performing of the implantation process, performing a pre-clean process to the workpiece,
   wherein the implantation process comprises a non-zero tilt angle.

2. The method of claim 1, wherein the dielectric layer comprises silicon nitride, silicon carbonitride, or silicon.

3. The method of claim 1, wherein the implantation process comprises use of xenon, or argon.

4. The method of claim 1, wherein the non-zero tilt angle is between about 10° and about 85°.

5. The method of claim 1,
   wherein the implantation process causes oxidation of the dielectric layer to form an oxidized portion of the dielectric layer,
   wherein the pre-clean process removes the oxidized portion of the dielectric layer.

6. The method of claim 1,
   wherein the implantation process causes damages to the dielectric layer to form a damaged portion of the dielectric layer,
   wherein the pre-clean process removes the damaged portion of the dielectric layer.

7. The method of claim 1, further comprising:
   before the implantation process, performing a pre-silicide implantation process to the workpiece,
   wherein the pre-silicide implantation process implants exposed source/drain feature with germanium.

8. The method of claim 7, wherein the pre-silicide implantation process comprises a zero-degree tilt angle.

9. A method, comprising:
   receiving a workpiece comprising:
      a first gate structure,
      a second gate structure,
      a source/drain opening between the first gate structure and the second gate structure, and
      a source/drain feature exposed in the source/drain opening;
   conformally depositing a dielectric layer over sidewalls of the source/drain opening and a top surface of the source/drain feature;
   anisotropically etching the dielectric layer to expose the source/drain feature;
   performing a first implantation process to the exposed source/drain feature;
   after the performing of the first implantation process, performing a second implantation process to the dielectric layer to form a treated portion; and
   after the performing of the second implantation process, performing a pre-clean process to the workpiece,
   wherein the pre-clean process etches the treated portion faster than it does the dielectric layer.

10. The method of claim 9,
wherein the workpiece further comprises a gate spacer disposed along the sidewalls of the source/drain opening,
wherein the conformally depositing of the dielectric layer deposits the dielectric layer on the gate spacer.

11. The method of claim 9, wherein the pre-clean process comprises use of hydrofluoric acid, ammonia, or water.

12. The method of claim 9, wherein the dielectric layer comprises silicon nitride, silicon carbonitride, or silicon.

13. The method of claim 9,
wherein the first implantation process comprises use of germanium,
wherein the second implantation process comprises use of xenon, or argon.

14. The method of claim 9,
wherein the first implantation process comprises a zero-degree tilt angle,
wherein the second implantation process comprises a non-zero tilt angle.

15. The method of claim 9, where an ion beam energy of the second implantation process is greater than an ion beam energy of the first implantation process.

16. The method of claim 9, where an implantation dosage the second implantation process is greater than an implantation dosage of the first implantation process.

17. The method of claim 9, wherein the second implantation process comprises a process temperature between about −100° C. and about 500° C.

18. A method, comprising:
receiving a workpiece comprising a source/drain feature exposed between two gate structures;
conformally depositing a dielectric layer over a top surface of the source/drain feature and along sidewalls of the two gate structures to define a source/drain opening between the two gate structures;
after the conformally depositing, anisotropically etching the dielectric layer to expose the source/drain feature;
performing an implantation process to the dielectric layer to form a treated portion of the dielectric layer;
after the performing of the implantation process, performing a pre-clean process to the workpiece;
forming a silicide layer over the source/drain feature; and
forming a metal plug over the silicide layer,
wherein the implantation process implants xenon or argon.

19. The method of claim 18,
wherein, after the anisotropically etching of the dielectric layer, the source/drain opening comprises a necking profile,
wherein the pre-clean process reduces the necking profile by removing the treated portion.

20. The method of claim 18, wherein the forming of the silicide layer comprises:
depositing a metal precursor over the workpiece;
annealing the workpiece to bring about silicidation between the metal precursor and the source/drain feature to form the silicide layer; and
removing the metal precursor along the sidewalls of the source/drain opening.

\* \* \* \* \*